US009360777B2

(12) United States Patent
Mizumura

(10) Patent No.: US 9,360,777 B2
(45) Date of Patent: Jun. 7, 2016

(54) APPARATUS AND METHOD FOR ALIGNMENT PROCESSING

(71) Applicant: V TECHNOLOGY CO., LTD., Yokohama-shi (JP)

(72) Inventor: Michinobu Mizumura, Yokohama (JP)

(73) Assignee: V TECHNOLOGY CO., LTD., Yokohama-Shi (JP)

( * ) Notice: Subject to any disclaimer, the term of this patent is extended or adjusted under 35 U.S.C. 154(b) by 241 days.

(21) Appl. No.: 13/916,492

(22) Filed: Jun. 12, 2013

(65) Prior Publication Data

US 2013/0271742 A1    Oct. 17, 2013

Related U.S. Application Data

(63) Continuation of application No. PCT/JP2010/072582, filed on Dec. 15, 2010.

(51) Int. Cl.
  *G03B 27/42* (2006.01)
  *G03F 9/00* (2006.01)
  *G02F 1/13* (2006.01)
  *G02F 1/1337* (2006.01)

(52) U.S. Cl.
  CPC .......... *G03F 9/7069* (2013.01); *G02F 1/1303* (2013.01); *G02F 1/133788* (2013.01)

(58) Field of Classification Search
  CPC .............. G02F 2001/133738; G02F 1/133753; G02F 1/13394; G02F 2001/133354; G02F 2001/133757; G02F 2001/133773
  See application file for complete search history.

(56) References Cited

U.S. PATENT DOCUMENTS

| 5,321,502 A * | 6/1994 | Matsumoto et al. .......... 356/490 |
| 2003/0025864 A1 | 2/2003 | Chida et al. |
| 2012/0064441 A1 * | 3/2012 | Tanaka .............................. 430/5 |
| 2012/0293763 A1 * | 11/2012 | Inoue et al. .................... 349/178 |

FOREIGN PATENT DOCUMENTS

| JP | 60-217339 A | 10/1985 |
| JP | 2001-066602 A | 3/2001 |
| JP | 2002-031804 A | 1/2002 |

(Continued)

OTHER PUBLICATIONS

International Search Report for International Application No. PCT/JP2010/072582 mailed Mar. 15, 2011.

*Primary Examiner* — Mesfin T Asfaw
(74) *Attorney, Agent, or Firm* — McDermott Will & Emery LLP

(57) ABSTRACT

The present invention employs a plurality of photomasks each having first and second apertures of which widths are set so that adjacent end regions of the adjacent first and second alignment regions overlap with each other with an overlapping dimension approximately equal to a tracking accuracy of an alignment device. The photomasks are arranged alternately in a direction intersecting the scanning direction of the substrate so that the first and the second apertures are arranged at a constant pitch. In this state, two polarized lights, that are different in at least one of polarization direction and incident angle to a substrate, are made to be incident into the first and the second apertures, respectively, to irradiate an alignment film on the substrate with the two lights that have passed through the first and the second apertures, respectively, to form the first and the second alignment regions adjacently to each other.

6 Claims, 11 Drawing Sheets

(56) References Cited

FOREIGN PATENT DOCUMENTS

| JP | 2003-043492 A | 2/2003 |
| JP | 2010-039485 A | 2/2010 |
| WO | 2007/086474 A1 | 8/2007 |
| WO | 2008/108032 A1 | 9/2008 |
| WO | WO-2010/137402 A1 | 12/2010 |

\* cited by examiner

US 9,360,777 B2

APPARATUS AND METHOD FOR ALIGNMENT PROCESSING

CROSS-REFERENCE TO RELATED APPLICATION

This application is a continuation application of PCT/JP2010/072582, filed on Dec. 15, 2010.

BACKGROUND OF THE INVENTION

1. Field of the Invention

The present invention relates to an apparatus for alignment processing which irradiates a moving substrate with polarized light via a plurality of photomasks to form two types of alignment regions having different alignment states of liquid crystal molecules that are alternately arranged into a stripe form, and more specifically, relates to an apparatus and a method for alignment processing which reduces alignment disturbance of liquid crystal molecules formed along a stitching line between a plurality of photomasks.

2. Description of Related Art

Conventionally, this sort of an apparatus for alignment processing is one which employs a photomask having a plurality of first and second apertures arranged alternately in parallel at a constant pitch so that two polarized lights having different incident angles, pass through the respective apertures, and the apparatus is configured to irradiate a substrate, that is being scanned under the photomask, with the two polarized lights through the photomask to form first and second alignment regions having different alignment states of liquid crystal molecules adjacent to each other on an alignment film coating the substrate (see, for example, refer to Japanese Laid-Open Patent Application No. 2010-39485).

In such a conventional apparatus for alignment processing, in order to apply alignment processing to a large-area substrate in a single step, as illustrated in FIG. 10, it is necessary to arrange a plurality of photomasks 2 alternately in a direction intersecting a scanning direction of the substrate so that the plurality of the first and the second apertures 1A and 1B are arranged in the direction intersecting the scanning direction of the substrate (indicated by an arrow A) at a constant pitch P, and furthermore, it is necessary to move the photomasks 2 so as to follow a movement of the substrate in the direction intersecting the scanning direction of the substrate that is scanned under the photomask 2. In this case, since the first and the second apertures 1A and 1B can be formed by using a photolithography technique, it is possible to form these apertures with high positioning accuracy in the photomask 2. Accordingly, in general, as illustrated in FIG. 10, the apertures 1A and 1B in the same photomask 2 are each formed to have a width W in the direction intersecting the substrate-scanning direction that is equal (W=P) to their arrangement pitch P in the direction so that ends of first and second alignment regions 3A and 3B parallel to the substrate-scanning direction indicated by an arrow A (refer to FIG. 11) contact with each other.

However, when an alignment process is carried out by employing a plurality of such photomasks 2, as illustrated in FIG. 11, a multiple-exposure region 4 having a width corresponding to an tracking accuracy (±Δw) of the photomask 2 to the substrate 2 is formed along a stitching line between a plurality of photomasks 2, thus disturbing alignment in the region. Accordingly, if an alignment-processed substrate 9 having such a multiple exposure region 4 is employed, for example, in a display device, a streak, that is a bright line or a dark line corresponding to the multiple-exposure region 4, may be formed in a display screen. Particularly, when such a streak is formed in a part of the display screen, there occurs a problem that the streak is recognized as a defect since human eyes are sensitive to such a streak.

Under these circumstances, it is an object of the present invention to address the problems and to provide an apparatus and a method for alignment processing which reduce visibility of disturbance of alignment of liquid crystal molecules formed along a stitching line between a plurality of photomasks.

SUMMARY OF THE INVENTION

In order to achieve the above objects, an apparatus for alignment processing according to an aspect of the present invention for irradiating the substrate with two lights through a photomask to form a plurality of first alignment regions and a plurality of second alignment regions having different alignment states of liquid crystal molecules adjacent to each other on an alignment film coating the substrate, the apparatus includes: a photomask having a plurality of first apertures and a plurality of second apertures arranged alternately in parallel at a constant pitch so that the two polarized lights, that are different in at least one of polarization direction and incident angle to a substrate, pass through the respective apertures; and an alignment device that moves the photomask so as to track a movement of a substrate, that is scanned under the photomask, in a direction intersecting a scanning direction of the substrate, in which the apparatus includes a plurality of the photomasks arranged alternately in the direction intersecting the scanning direction of the substrate so that the first and the second apertures are arranged alternately at a constant pitch in the direction intersecting the scanning direction of the substrate; and the widths of the first and the second apertures are set so that adjacent end regions of adjacent first and second alignment regions overlap with each other with an overlapping dimension approximately equal to a tracking accuracy of the alignment device.

Furthermore, the first and the second apertures are formed so that their widths in the direction intersecting the scanning direction of the substrate are equal to each other.

Furthermore, the first and the second apertures are formed so that their widths in the direction intersecting the scanning direction of the substrate are different from each other.

Furthermore, the apparatus is configured to make one polarized light of two polarized lights, that are produced by splitting a polarized light by a beam splitter, be incident into the first aperture at a predetermined angle, and to make the other polarized light of the two polarized lights be incident into the second aperture at an angle different from the above angle.

Further, the beam splitter is disposed so that its reflective plane is at an intermediate position between the first and the second apertures of the photomask and in a plane substantially perpendicular to the photomask.

Furthermore, the apparatus is configured to make one polarized light of two polarized lights having different polarization directions be incident into the first aperture, and to make the other polarized light of the two polarized lights be incident into the second aperture.

Furthermore, the plurality of photomasks are arranged so that an end region of an downstream photomask is overlapped with an end region of an upstream photomask when they are observed from the scanning direction of the substrate, and that the positions of the first and the second apertures in the end region of one photomask are the same as the positions of the first and the second apertures in the end region of the other photomask in the direction intersecting the scanning direction of the substrate, and the areas of the first and the second apertures in the end regions are a half of the areas of those apertures in the central regions of the photomasks.

Furthermore, A method for alignment processing of the present invention includes: making two polarized lights, that are different in at least one of polarization direction and incident angle to the substrate, respectively pass through first and second apertures formed in a photomask arranged alternately in parallel at a constant pitch in a direction intersecting the scanning direction of the substrate, to irradiate the substrate with the two lights to thereby form a plurality of first alignment regions and a plurality of second alignment regions having different alignment states of liquid crystal molecules adjacent to each other on an alignment film coating the substrate, while scanning a substrate in a constant direction at a constant speed. The method employs a plurality of the photomasks each having the first and the second apertures of which widths are set so that adjacent end regions of the adjacent first and second alignment regions overlap with each other with an overlapping dimension approximately equal to a tracking accuracy of the photomasks, and the plurality of the photomasks are arranged alternately in the direction intersecting the scanning direction of the substrate so that the first and the second apertures are arranged alternately at a constant pitch in the direction intersecting the scanning direction of the substrate. The method includes moving each photomask so as to track a movement of the substrate, that is conveyed under the photomask, in the direction intersecting a scanning direction of the substrate, while irradiating the substrate with the two lights through the photomask to form a plurality of first alignment regions and a plurality of second alignment regions so that their adjacent end regions overlap with each other with a predetermined overlapping dimension.

According to a first aspect of the invention, it is possible to form a plurality of the first and the second alignment regions so that adjacent end regions of adjacent first and second alignment regions overlap with each other with a predetermined overlapping dimension over the entire exposure region of a substrate. Consequently, it is possible to reduce visibility of alignment disturbance of liquid crystal molecules formed along a stitching line between a plurality of photomasks.

Furthermore, according to a second aspect of the invention, it is possible to easily form a plurality of the first and the second alignment regions so that adjacent end regions of adjacent first and second alignment regions overlap with each other with a predetermined overlapping dimension.

Further, according to a third aspect of the invention, it is possible to easily carry out alignment processing of TFT substrates or color filters of liquid crystal displays.

Further, according to a fourth aspect of the invention, it is possible to make two polarized lights, that are produced by splitting a light by a beam splitter, be directly incident into the first and the second apertures, respectively, of the photomask. Accordingly, it is possible to reduce the number of components constituting a polarizing optical system to reduce the cost of the apparatus.

Furthermore, according to a fifth aspect of the invention, it is possible to easily produce polarizing filters for 3D liquid crystal televisions.

Furthermore, according to a sixth aspect of the invention, even when a multiple exposure is carried out with a combination of respective first apertures and a combination of respective second apertures in end portions of the adjacent photomasks, that are adjacent to each other when they are observed in the scanning direction of the substrate, it is possible to carry out alignment processing with a proper exposure amount without causing over exposure. Furthermore, even if a photomask makes fine movement to track a substrate being scanned with meandering, there is no risk that a non-exposure portion is formed.

DESCRIPTION OF THE PREFERRED EMBODIMENTS

Figure 1:
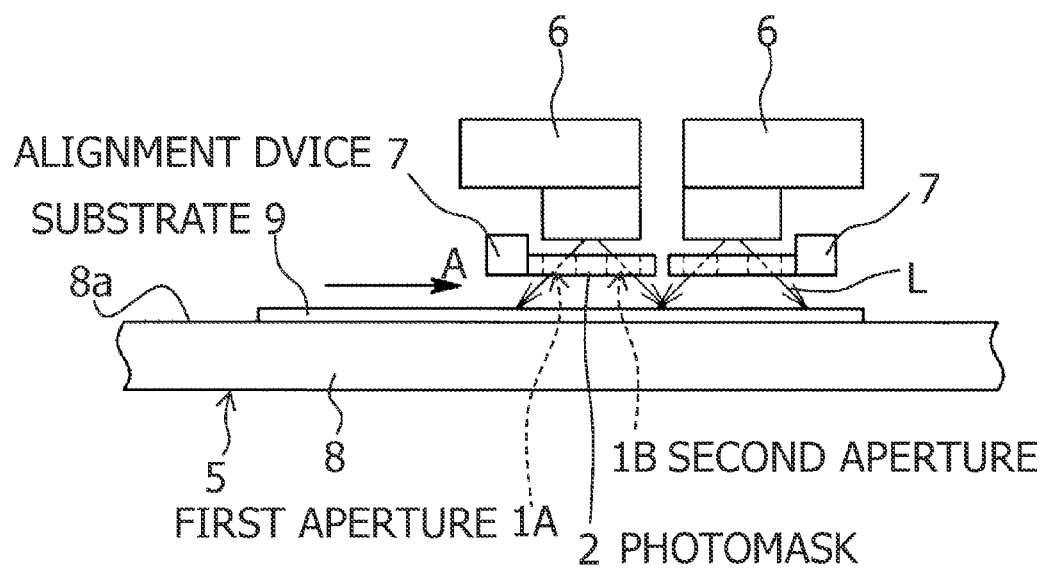
FIG. 1 is a front view schematically illustrating the construction of a first embodiment of an apparatus for alignment processing of the present invention.

Next, embodiments of the present invention will be described in detail with reference to attached drawings. FIG. 1 is a plan view schematically illustrating the construction of a first embodiment of an apparatus for alignment processing of the present invention. This apparatus for alignment processing forms two sorts of alignment regions having different alignment states of liquid crystal molecules, and the two sorts of alignment regions are alternately arranged to form a stripe shape, while moving the substrate. The apparatus includes a stage system 5, a plurality of photomasks 2, a plurality of polarizing optical systems 6 and a plurality of alignment device 7.

The above stage system 5 scans a substrate 9, that is coated with an alignment film for aligning liquid crystal molecules and placed on an upper surface 8a of a stage 8, in a direction indicated by an arrow A illustrated in FIG. 1 at a constant speed. For example, the stage system 5 scans a substrate 9 in a state that it is lifted a constant amount off the upper surface 8a of the stage 8 by an air blown and drawn by the stage 8, and that both edges of the substrate 9 in the direction indicated by arrow A are held by a scanning mechanism, not shown.

Figure 2:
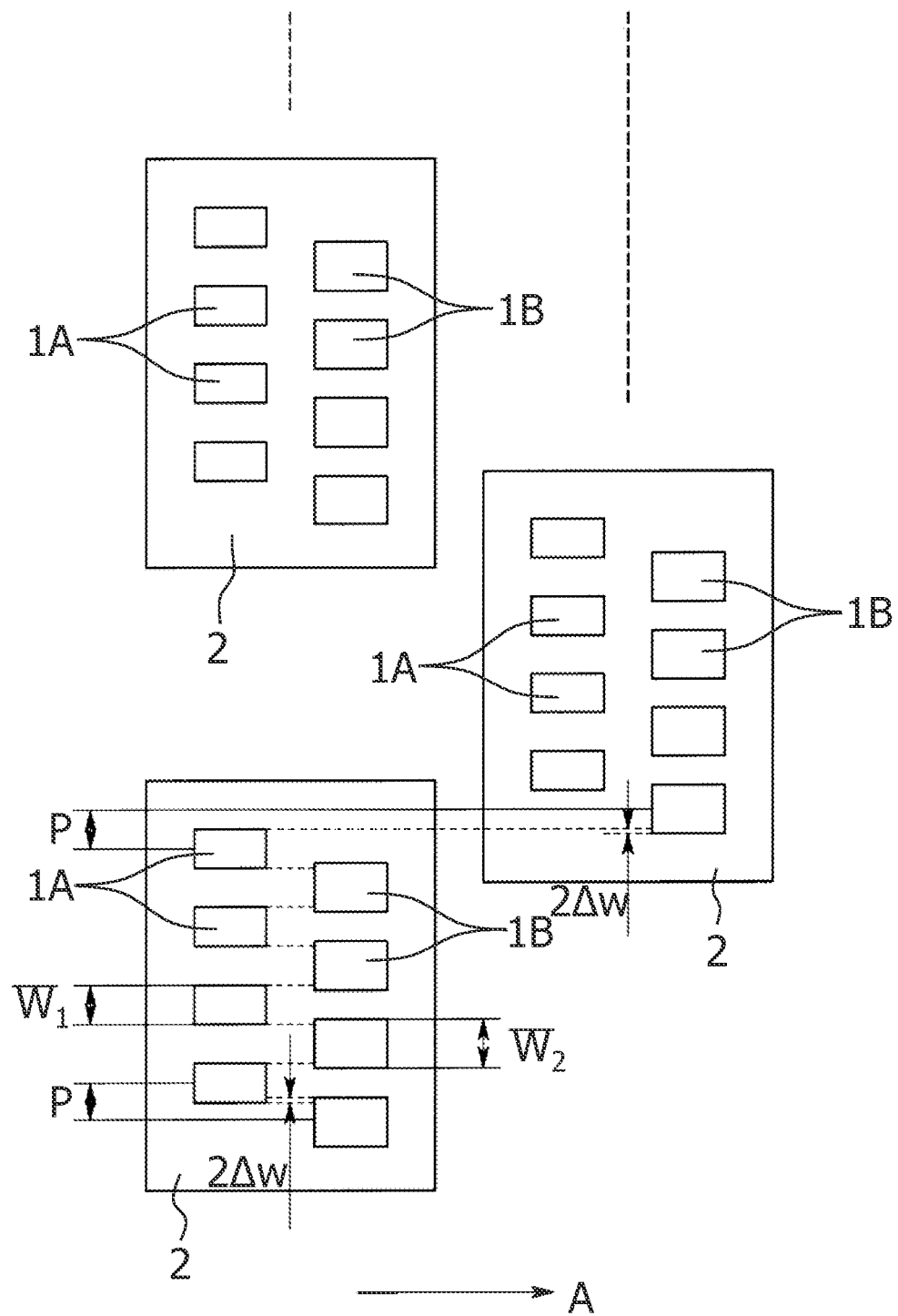
FIG. 2 is a plan view illustrating an example of the construction of a photomask to be used.
Figure 3:
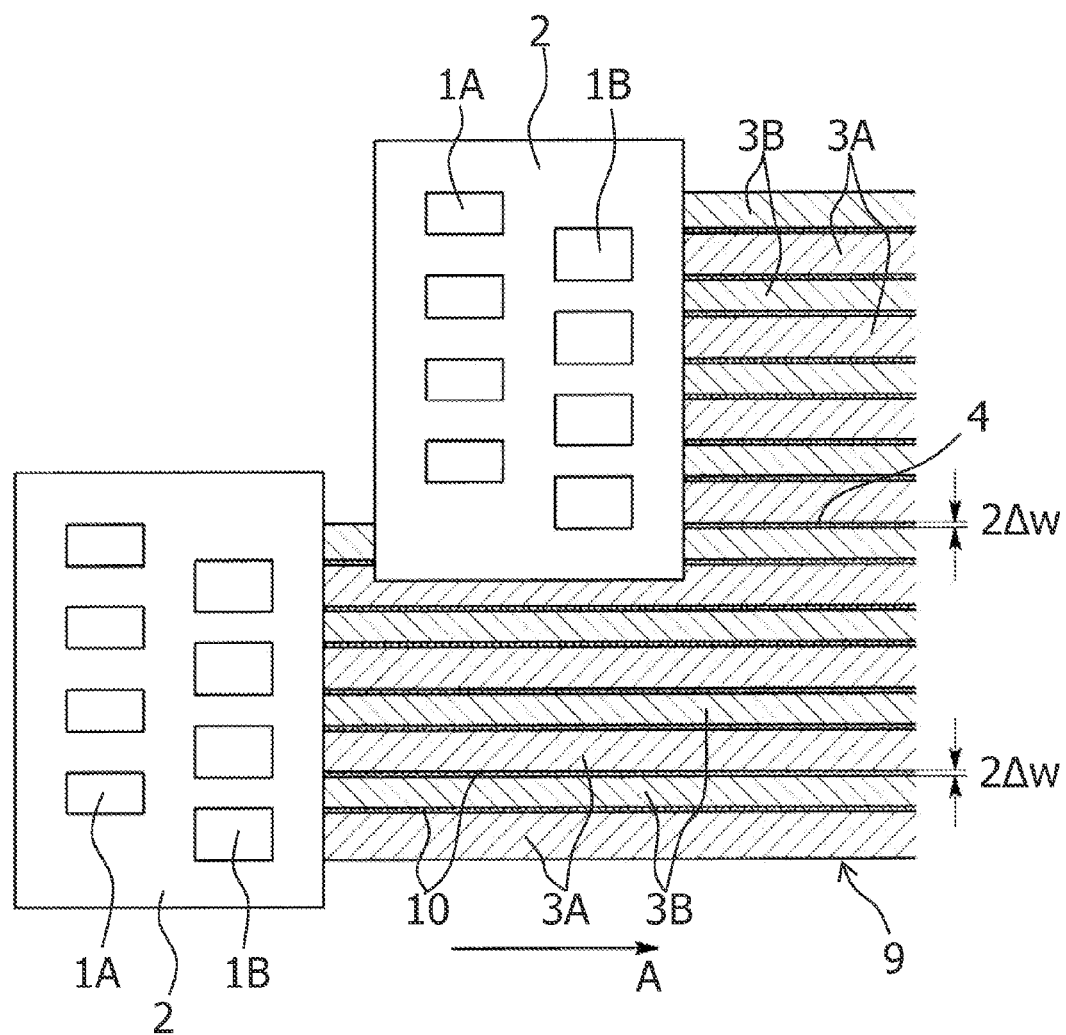
FIG. 3 is an explanatory view illustrating alignment processing employing the photomask of FIG. 2.

A plurality of photomasks 2 is arranged so as to face to the upper surface 8a of the stage system 5. Each of the plurality of photomasks 2 has, as illustrated in FIG. 2, a plurality of first and second apertures 1A and 1B arranged alternately in parallel at a constant pitch P so that two polarized lights having different incident angles, pass through the respective apertures. The plurality of photomasks 2 are arranged alternately in a direction intersecting the scanning direction (direction of arrow A) of the substrate so that a plurality of first and second apertures 1A and 1B formed in the photomasks are arranged alternately in parallel at a constant pitch P, and the photomasks are each held by a mask stage, not illustrated. Each of the photomasks 2 is configured to make a fine movement so as to track a movement of the substrate 9, that is being scanned under the photomasks, in a direction intersecting the scanning direction of the substrate by an alignment device 7 to be described later. By this configuration, it is possible to irradiate the substrate 9, that is being scanned, with the above two polarized lights L through the plurality of photomasks 2 to form a plurality of first and second alignment regions 3A and 3B having different alignment states of liquid crystal molecules so as to be adjacent to each other on an alignment film coating the substrate 9 as illustrated in FIG. 3.

In this embodiment, the widths of first and the second apertures 1A and 1B of the photomask 2 in the direction intersecting the scanning direction of the substrate are set so that adjacent end regions 10 of the adjacent first and second alignment regions 3A and 3B overlap with each other with an overlapping dimension (2Δw) approximately equal to two times the absolute value of an tracking accuracy (±Δw) of the alignment device 7.

In more detail, the above photomask 2 is formed so that the width of the first aperture 1A in a direction intersecting the scanning direction of the substrate is a dimension $W_1$ that is the same as the arrangement pitch P, and the width of the second aperture 1B in the above direction is a dimension $W_2$ ($>W_1$). That is, the above photomask 2 is formed so that their widths are different from each other. Thus, the above photomask 2 is formed so that adjacent end regions of the first aperture 1A and the second aperture 1B overlap with an overlapping dimension of 2Δw when they are observed in the scanning direction of the substrate.

Over the photomasks 2, polarizing optical systems 6 are provided, respectively. The polarizing optical systems 6 are each configured to make polarized lights L, that have different incident angles to the substrate 9, pass through the first and the second apertures 1A and 1B, respectively, of the photomask 2. In this embodiment, they are each configured to make two polarized lights L having polarization directions parallel to the scanning direction of the substrate (direction of arrow A) be incident into a masking surface of the photomask 2 (or a substrate 9 surface) at different incident angles such as ±45°.

Figure 4:
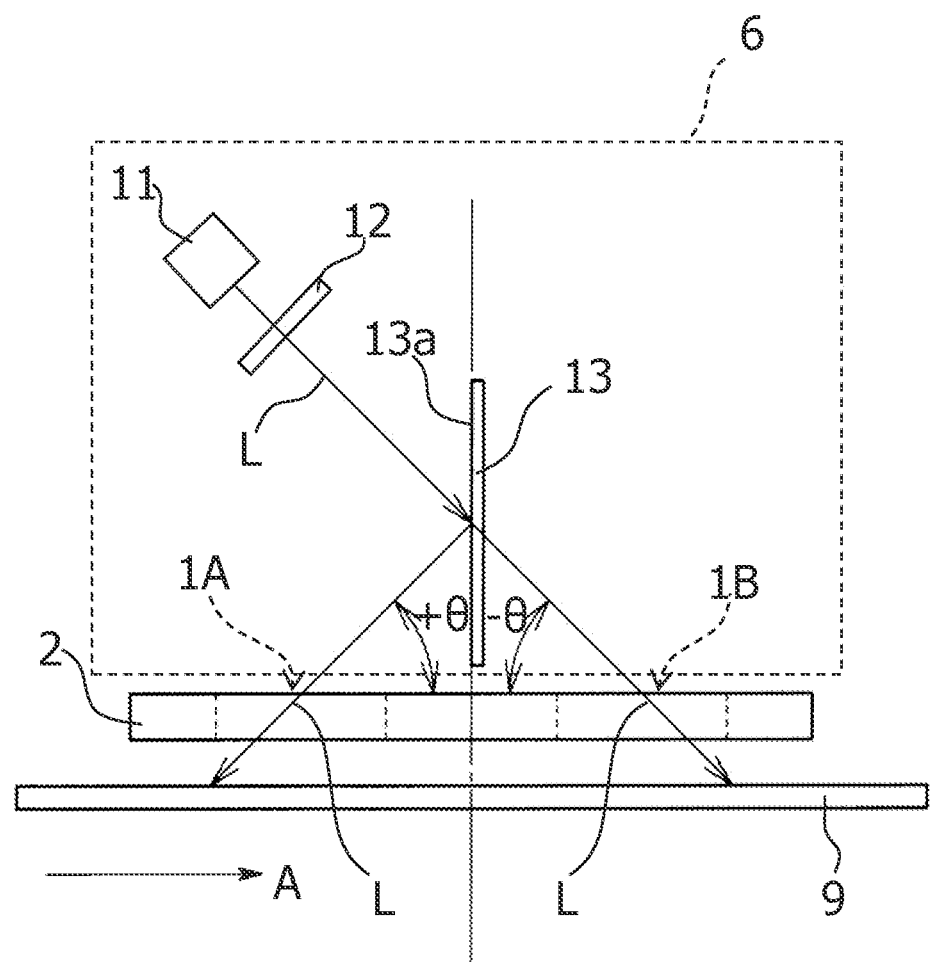
FIG. 4 is a front view illustrating an example of the construction of an exposure optical system used in a first embodiment.

FIG. 4 illustrates a specific example of the construction of the above optical system 6, which includes, in the following order form the upstream side toward the downstream side along the propagation direction of light, a light source 11 that is a super high pressure mercury lamp that emits ultraviolet rays; a polarizer 12 that selectively transmits polarized light L having a polarization direction parallel to the substrate-scanning direction out of a random light emitted from the light source 11; and a 50% beam splitter (hereinafter referred to as "half mirror 13") that is disposed so that its reflective plane 13a is inclined with respect to the optical axis and that transmits a half of the polarized light L and reflects the other half of the polarized light L. In this case, as illustrated in FIG. 4, when the half mirror 13 is disposed so that its reflective plane 13a is at an intermediate position between the first and the second apertures 1A and 1B of the photomask 2 and in a plane substantially perpendicular to the photomask 2, it is possible to make two polarized lights L, that are split beams into two directions, be directly incident into the first and the second apertures 1A and 1B at respective incident angles (±θ), thereby reducing the number of components constituting the polarizing optical system 6.

Of course it is possible to make the two lights, that are split beams into two directions, be further reflected by a reflective mirror to make them incident into the first and the second apertures 1A and 1B of the photomask 2 at respective angles.

A plurality of alignment device 7 are provided, which enable fine movements of respective photomasks 2 independently in a direction intersecting the substrate-scanning direction. Each alignment device 7 is configured to move the photomask 2 to track movement of a substrate 9, that is being scanned in the direction of arrow A under the photomask 2, in a direction intersecting the substrate-scanning direction. For example, the alignment device includes an electrically driven X stage and an electromagnetic actuator etc. that are controlled and driven by a control device that is not illustrated.

Next, operation of an apparatus for an alignment processing having such a construction and a method for an alignment processing will be described.

First, a glass substrate such as a color filter substrate (substrate 9) on which an alignment film for aligning liquid crystal molecules having a constant thickness is formed by spin-coating or spray-coating etc., is positioned and placed on the upper surface 8a of the stage 8 of the stage system 5, and is moved in the direction of arrow A at a constant speed.

Subsequently, an image-capturing device, that is not illustrated, detects reference positions of reference patterns formed at regular intervals in the substrate-scanning direction indicated by arrow A on the substrate 9 (for example, ends of pixels of a color filter substrate, that are parallel to the substrate-scanning direction) at a position on the upstream side of the photomask in the substrate-scanning direction. The apparatus computes a horizontal distance of the above reference positions of the reference patterns in a direction intersecting the substrate-scanning direction from a reference position preliminary set in the image-capturing device (for example, an image-capturing center), to obtain a position displacement based on a target position stored in advance. Subsequently, the alignment device 7 makes fine movement of the photomask 2 in the direction intersecting the substrate-scanning direction so as to correct the position displacement and to track movement of the substrate 9 in the direction.

Simultaneously, as illustrated in FIG. 4, the polarizing optical system 6 makes polarized lights L of ultraviolet rays be incident into the first and the second apertures 1A and 1B at respective incident angles θ (for example, ±45°) to irradiate the alignment film on the substrate 9 with the lights L that have passed through the first and the second apertures 1A and 1B.

By this method, on the alignment film, as illustrated in FIG. 3, a plurality of first alignment regions 3A corresponding to the first apertures 1A and each having a stripe form extending in the direction of arrow A; and a plurality of second alignment regions 3B corresponding to the second apertures 1B and each having a stripe form extending in the direction of arrow A and having an alignment state different from the alignment state of the first alignment regions 3A, are alternately formed in the direction intersecting the substrate-scanning direction. In this case, the first and the second apertures 1A and 1B are formed so that adjacent end portions of the adjacent first and second apertures 1A and 1B overlap with each other with an overlapping dimension 2Δw when they are observed from the substrate-scanning direction as illustrated in FIG. 2, and thus, the first and the second alignment regions 3A and 3B are formed so that their adjacent end regions 10 overlap with each other with an overlapping dimension 2Δw over the entire exposure region of the substrate 9. Accordingly, it is possible to reduce visibility of alignment disturbance of liquid crystal molecules formed in a portion corresponding to a multi-exposure region 4 along a stitching line between the photomasks 2.

Here, when a line-CCD having a plurality of photo-detectors linearly arranged in the direction intersecting the substrate-scanning direction, is employed as the image-capturing device, it is possible to carry out position detection in real time and to carry out position alignment of the photomask 2 to the substrate 9 at a high speed. Accordingly, it is possible to increase a scanning speed of the substrate 9 to further reduce the tact of an alignment processing step.

Figure 5:
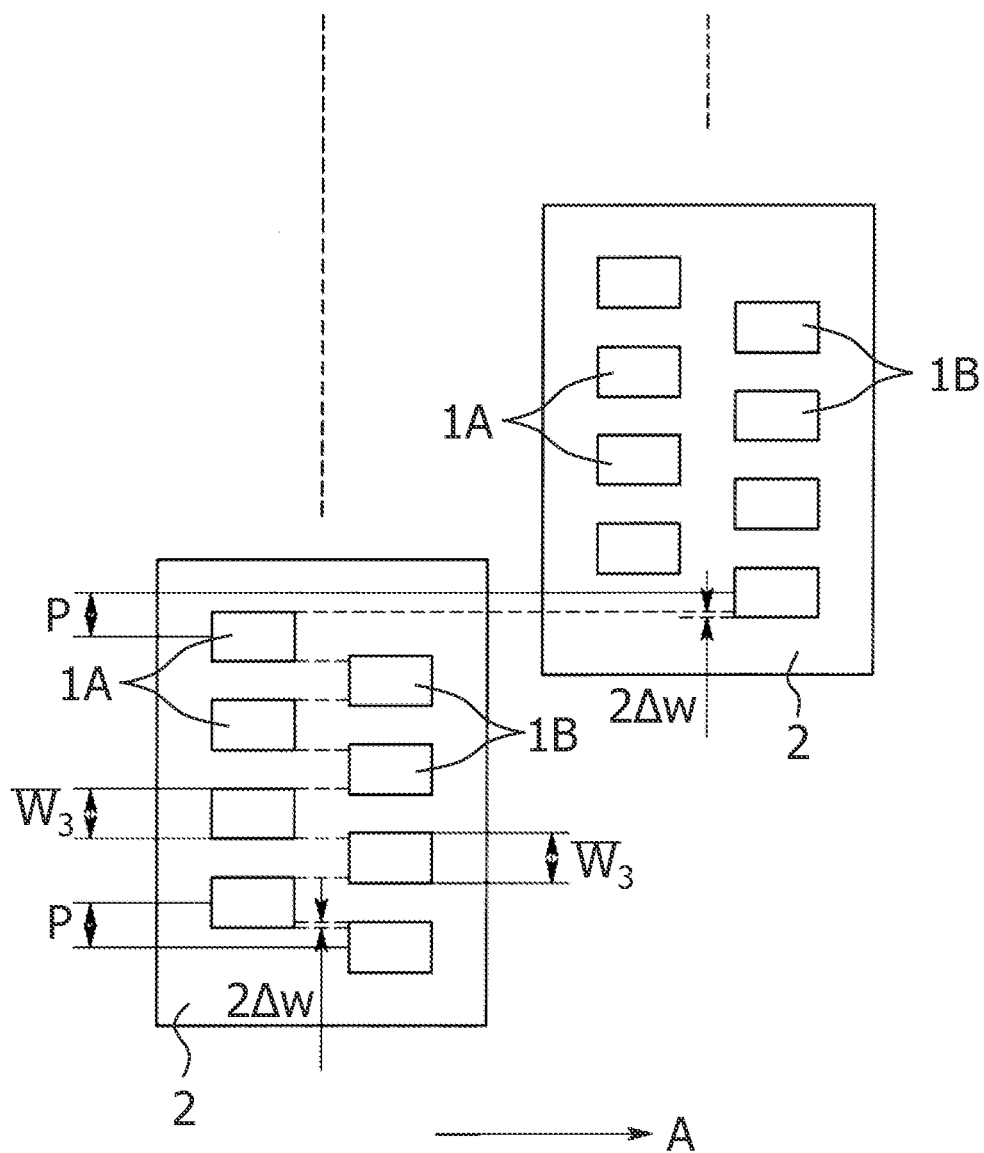
FIG. 5 is a plan view illustrating another example of the construction of the above photomask.
Figure 6:
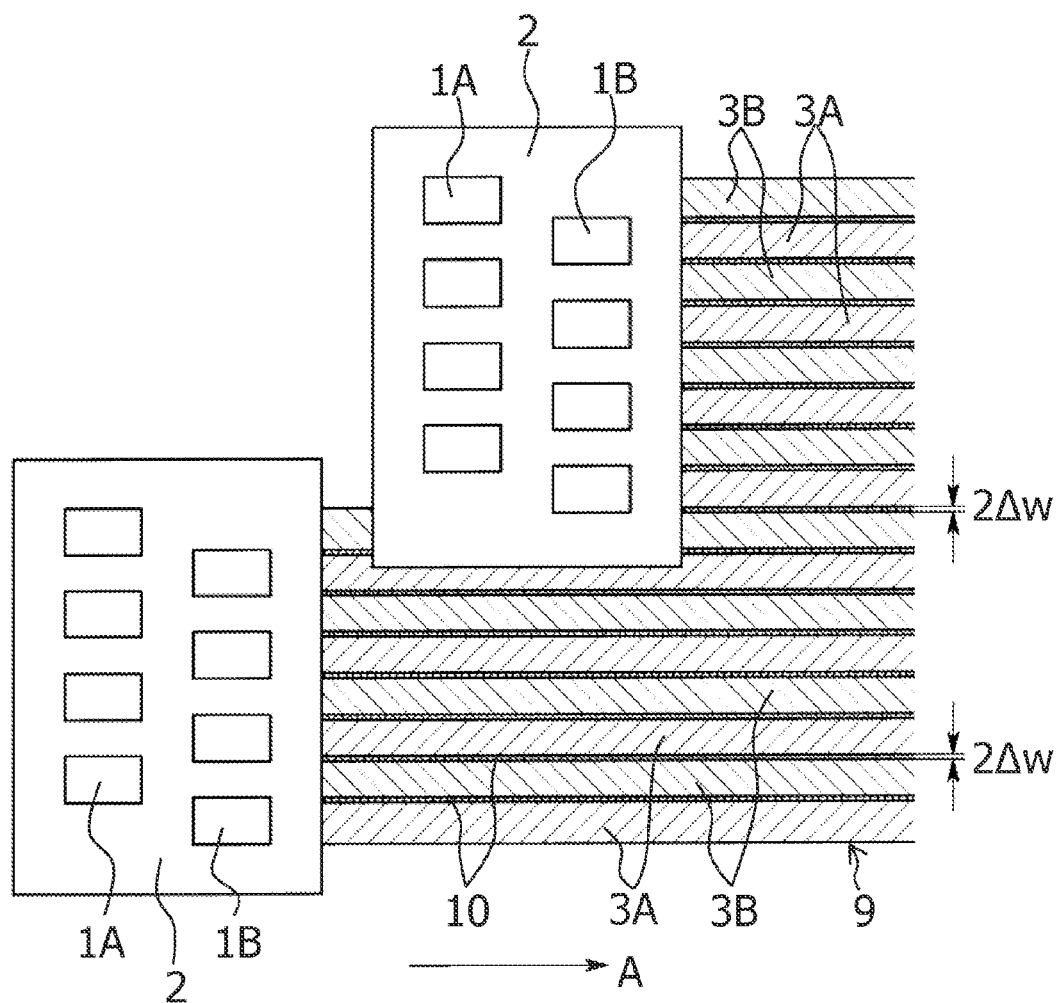
FIG. 6 is an explanatory view illustrating an alignment processing employing the photomask of FIG. 5.

FIG. 5 is illustrates another example of the construction of the photomask 2, in which the first and the second apertures 1A and 1B are formed so that their widths in a direction intersecting the substrate-scanning direction (direction of an arrow A) are equal and that the widths are a dimension $W_3$ that is greater than the alignment pitch P so that adjacent end regions of adjacent first and second apertures 1A and 1B overlap with each other with an overlapping dimension 2Δw when they are observed from the substrate-scanning direction. Also in this case, when two polarized lights L having different incident angles are made to be incident into the first and the second apertures 1A and 1B and the alignment film of the substrate 9 is exposed to the two polarized lights that have passed through the first and the second apertures 1A and 1B, respectively, as illustrated in FIG. 6, the first and the second alignment regions 3A and 3B are formed so that their adjacent end regions 10 overlap with each other with an overlapping dimension 2Δw over the entire exposure region of the substrate 9. Accordingly, also in this case, it is possible to reduce visibility of alignment disturbance of liquid crystal molecules formed in a portion corresponding to a multi-exposure region 4 along a stitching line between the photomasks 2.

Figure 7:
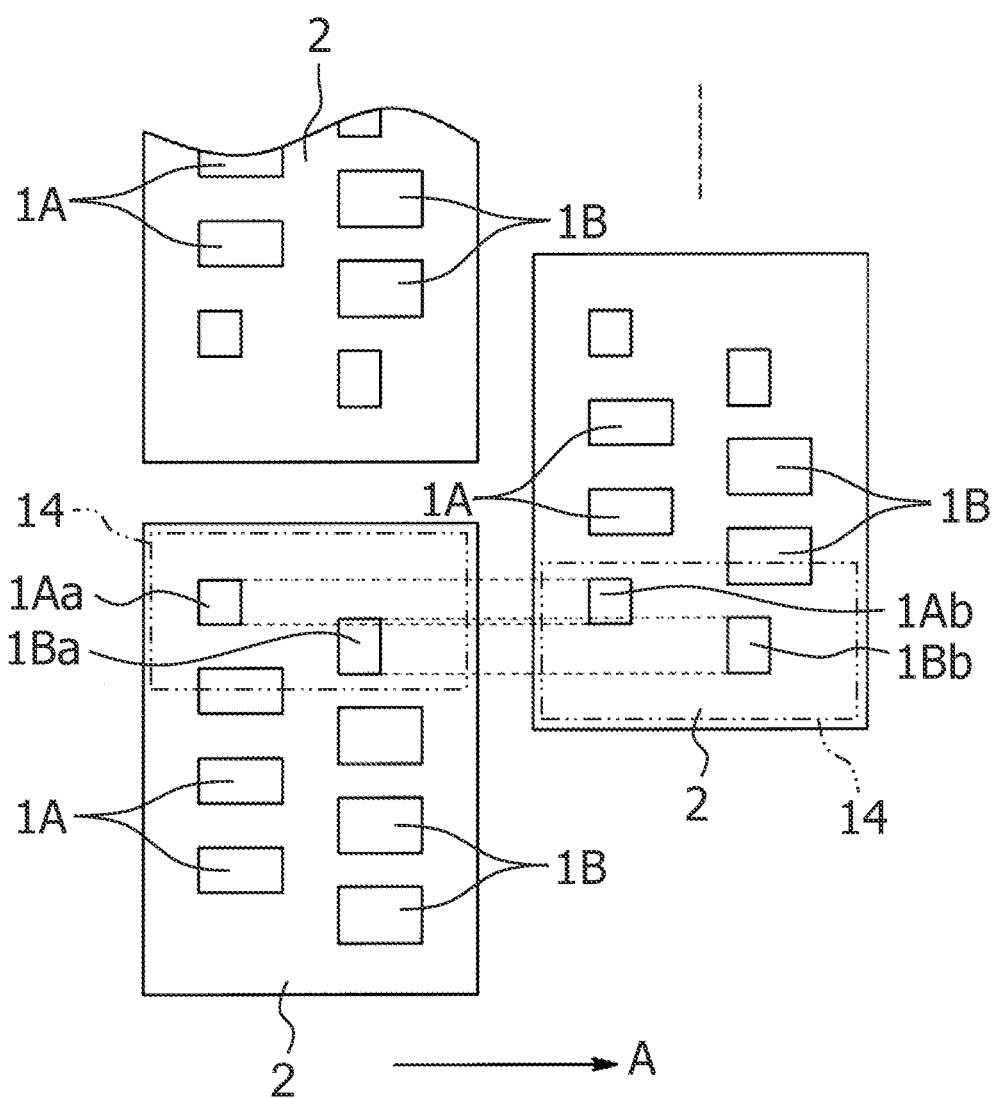
FIG. 7 is a plan view illustrating a modified example of the photomask illustrated in FIG. 2.
Figure 8:
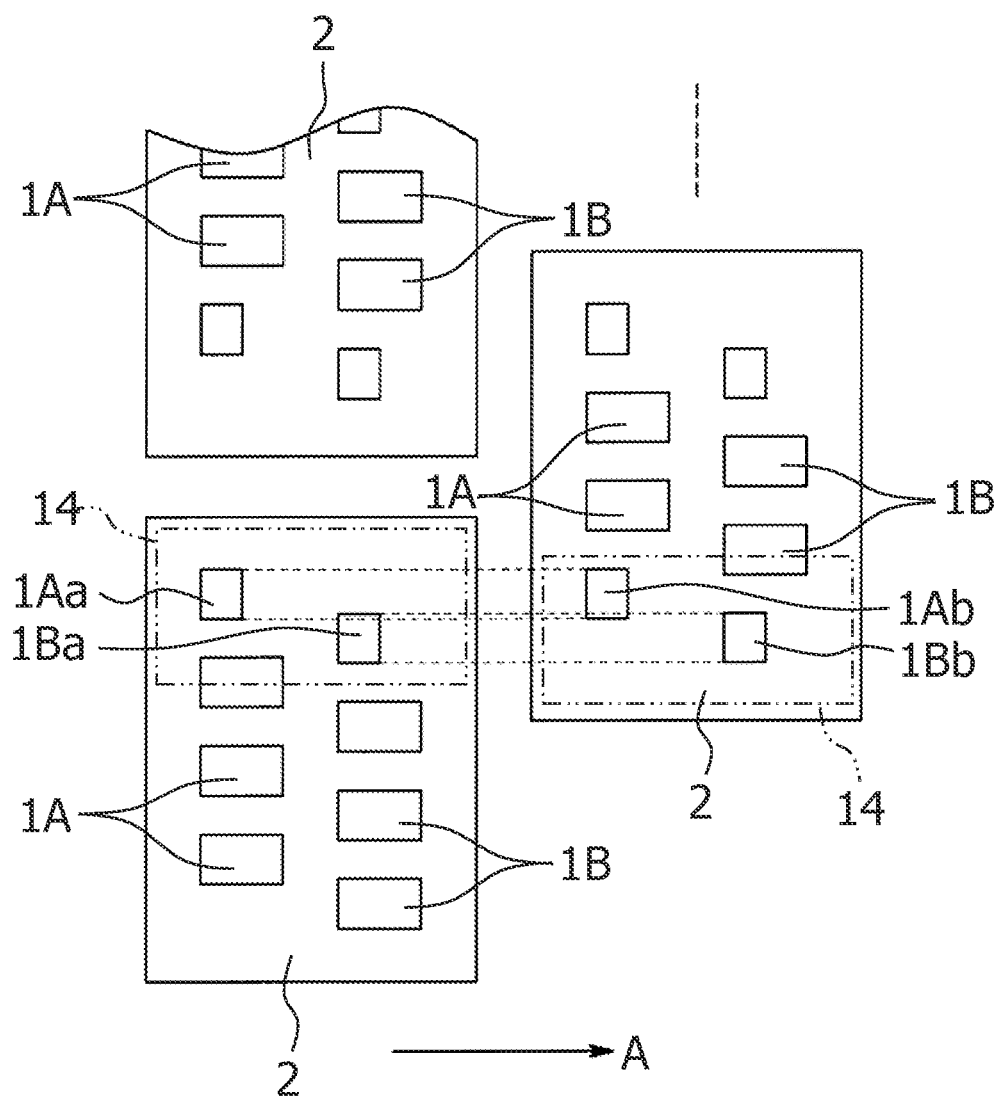
FIG. 8 is a plan view illustrating a modified example of the photomask of FIG. 5.

FIG. 7 is a plan view illustrating a modified example of the photomask illustrated in FIG. 2, and FIG. 8 is a plan view illustrating a modified example of the photomask of FIG. 5.

In each of these modified examples, a plurality of photomasks 2 are arranged so that an end region 14 of an downstream photomask 2 is overlapped with an end region 14 of an upstream photomask 2 when they are observed from the substrate-scanning direction, the positions of the first and the second apertures 1Aa and 1Ba in the end region 14 of one photomask 2 are the same as the positions of the first and the second apertures 1Ab and 1Bb in the end region 14 of the other photomask in a direction intersecting the scanning direction of the substrate, and the areas of the first and the second apertures 1Aa, 1Ab, 1Ba and 1Bb are a half of the areas of those apertures in the central regions of the photomasks 2.

In this case, the first and the second alignment regions 3A and 3B corresponding to the abovementioned end regions 14 are formed by multiple exposure. However, since the areas of the first and the second apertures 1Aa, 1Ab, 1Ba and 1Bb present in the end regions 14 are a half of the areas of those apertures 1A and 1B in the central regions of the photomasks 2, it is possible to carry out alignment processing with a proper exposure amount without causing over exposure even if the multiple exposure is carried out. Further, since the first and the second apertures 1Aa, 1Ba in the end regions 14 of the upstream photomask is arranged to be overlapped with the first and the second apertures 1Ab and 1Bb in the end regions 14 of the downstream photomask when they are observed from the substrate-scanning direction, there is no risk that a non-exposure portion is formed even if a photomask makes fine movement to track a substrate 9 being scanned with meandering.

Figure 9:
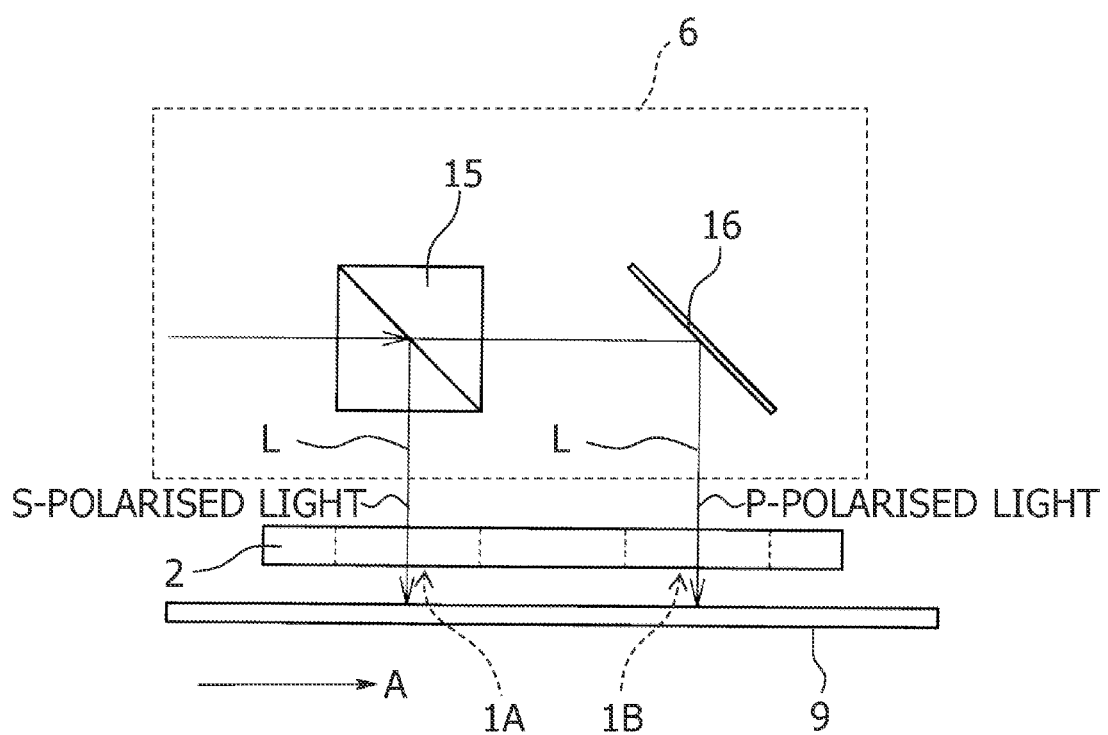
FIG. 9 is a substantial-part enlarged front view illustrating a second embodiment of the apparatus for alignment processing of the present invention.
Figure 10:
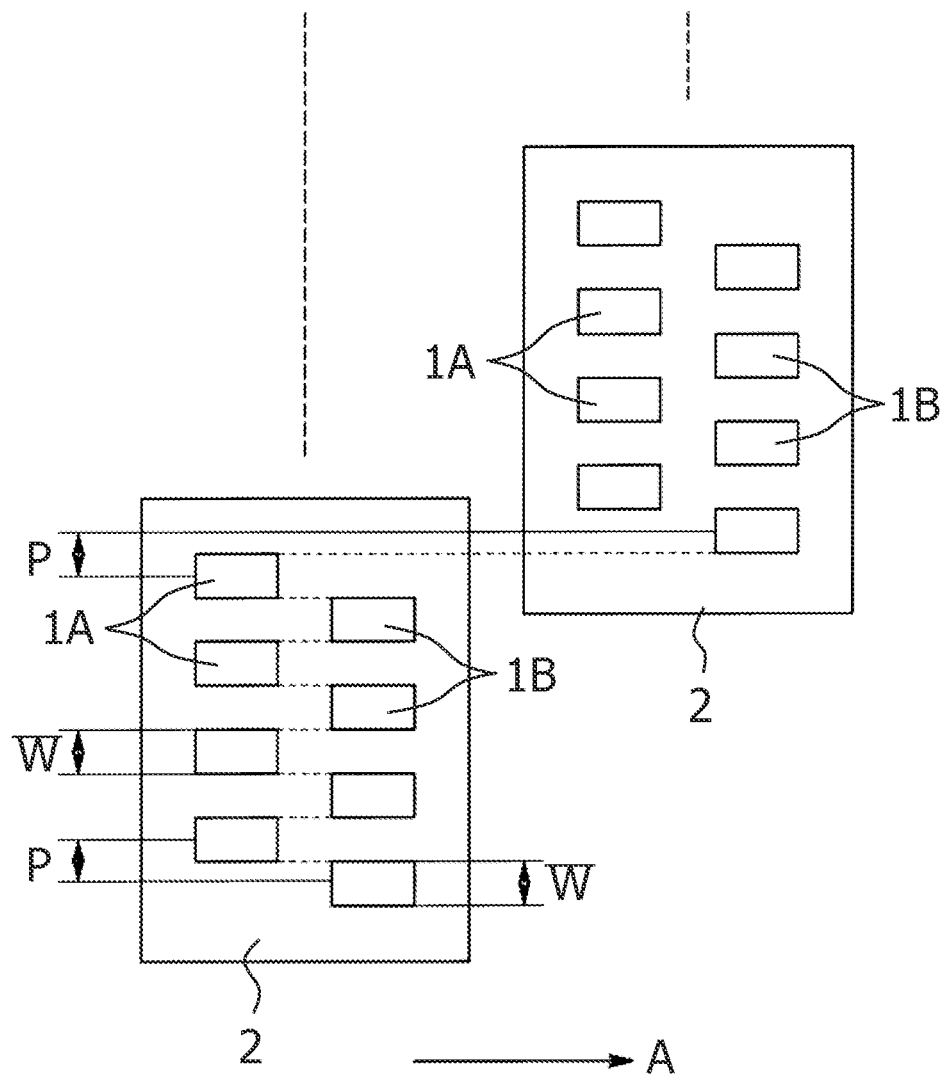
FIG. 10 is a plan view illustrating an arrangement example photomasks at a time of carrying out alignment processing of a large-area substrate by an apparatus for alignment processing of conventional technique.
Figure 11:
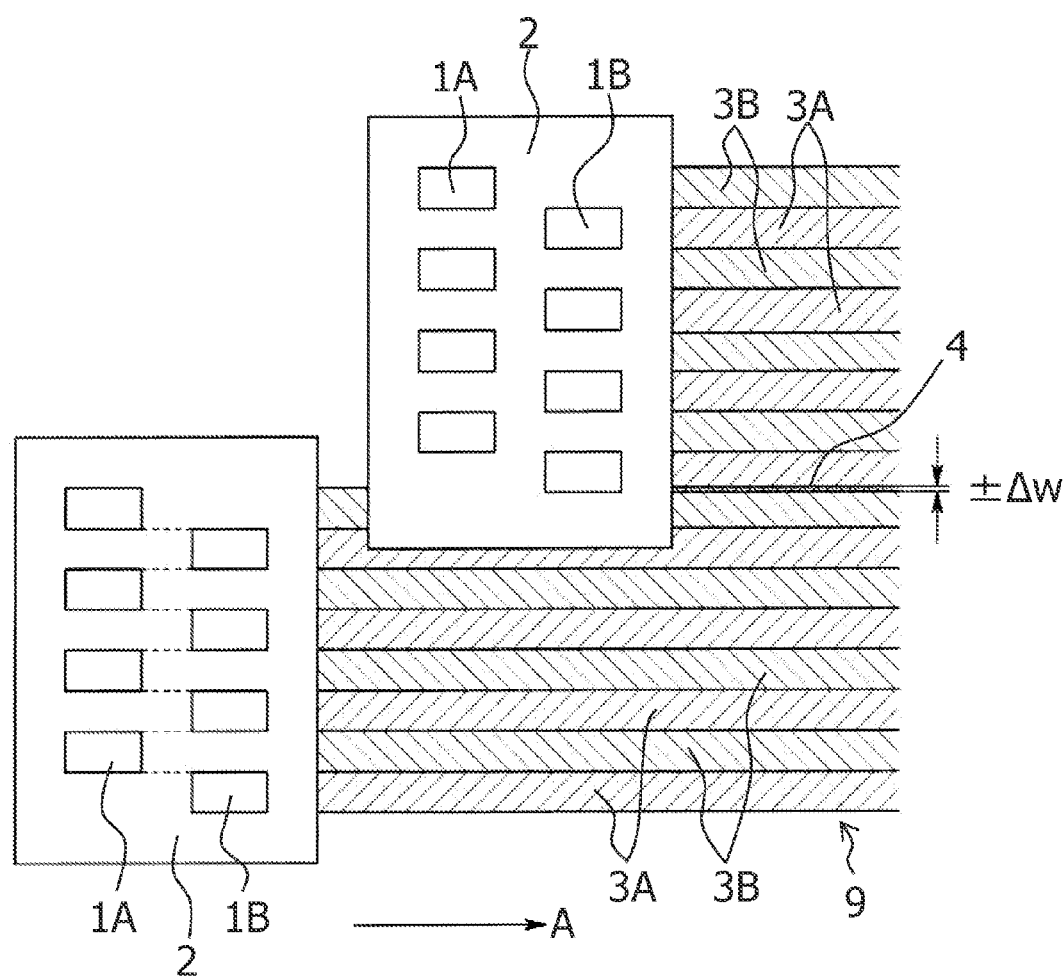
FIG. 11 is a plan view illustrating alignment processing employing the photomask illustrated in FIG. 10.

FIG. 9 is a substantial-part enlarged view illustrating a second embodiment of the apparatus for an alignment processing of the present invention.

This second embodiment is different from the above first embodiment in that the polarizing optical system 6 makes one polarized light (S-polarized beam) among two polarized lights L, that are produced by a polarizing beam splitter 15 and have respective polarization directions (P-polarized light and S-polarized light), be incident into the first aperture 1A of the photomask 2 and makes the other polarized light be incident into the second aperture 1B of the photomask 2. In this case, the incident angles of P-polarized light and S-polarized light may be the same or different. FIG. 9 illustrates a case in which both of the polarized lights L are perpendicularly incident into the photomask 2. Here, in FIG. 9, a reference numeral 16 denotes a full reflective mirror.

The photomask 2 to be employed in this embodiment may be one illustrated in FIG. 2 or one illustrated in FIG. 5. In this case, over the entire region of the substrate 9, a plurality of first alignment regions 3A and a plurality of second alignment regions 3B, that have perpendicular alignment directions to each other, are formed alternately into a stripe form so that their adjacent end regions 10 overlap with each other with an overlapping dimension of 2Δw.

Here, in the above first and second embodiments, the first and the second apertures 1A and 1B and the first and the second alignment regions 3A and 3B are illustrated so that they have the same width in the direction intersecting the substrate-scanning direction under assumption that there is no divergence of beam of each of the polarized lights L passing through the first and the second apertures 1A and 1B and radiated to the substrate 9. However, if there are divergences of beams of these lights, taking into consideration the divergences, the first and the second apertures 1A and 1B are preferably formed so that their widths in the direction intersecting the substrate-scanning direction, are narrower than the widths of the first and the second alignment regions 3A and 3B in the direction.

Further, in the above explanations, a case in which the polarizing optical system 6 splits a light emitted from a single light source 11, into two polarized lights L. However, the present invention is not limited thereto, but respective light sources 11 for the first and the second apertures 1A and 1B may be provided. In such a case, it is preferred to provide in front of each light source 11 a polarizer plate that selectively transmits a linearly polarized light L having a predetermined polarization direction from light emitted from the light source 11.

What is claimed is:

1. An apparatus for an alignment processing for irradiating a substrate with two polarized lights through a photomask, to irradiate an alignment film coating the substrate, to form a plurality of first alignment regions and a plurality of second alignment regions having different alignment states adjacent to each other on the alignment film at positions corresponding to a plurality of first apertures and a plurality of second apertures, the apparatus comprising:

a plurality of photomasks, each having a plurality of first apertures and a plurality of second apertures arranged alternately at a constant pitch so that the two polarized lights, that are different in incident angle to a substrate, pass through the respective apertures;

a beam splitter that produces two polarized lights by splitting a polarized light; and an alignment device that moves the photomask so as to track a movement of the substrate, that is scanned under the photomask, in a direction intersecting a scanning direction of the substrate, wherein the photomasks are arranged alternately in the direction intersecting the scanning direction of the substrate so that the first and the second apertures are arranged alternately at a constant pitch in the direction intersecting the scanning direction of the substrate, wherein the widths of the first and the second apertures in the direction intersecting the scanning direction of the substrate are set so that adjacent end regions of adjacent first and second alignment regions are formed in a state in which the adjacent end regions overlap with each other with an overlapping dimension equal to an absolute value of a tracking accuracy of the alignment device over the entire exposure region of the substrate, wherein the beam splitter is disposed so that its reflective plane is at an intermediate position between the first and the second apertures of the photomask and in a plane substantially perpendicular to the photomask, to make one polarized light of the two polarized lights be incident into the first aperture at a predetermined angle, and to make the other polarized light of the two polarized lights be incident into the second aperture at an angle different from the above angle.

2. The apparatus for an alignment processing according to claim 1, wherein the first and the second apertures are formed so that their widths in the direction intersecting the scanning direction of the substrate are equal to each other.

3. The apparatus for an alignment processing according to claim 1, wherein the first and the second apertures are formed so that their widths in the direction intersecting the scanning direction of the substrate are different from each other.

4. The apparatus for an alignment processing according to claim 1, which is configured to make one polarized light of two polarized lights having different polarization directions be incident into the first aperture, and to make the other polarized light of the two polarized lights be incident into the second aperture.

5. The apparatus for an alignment processing according to claim 1, wherein the plurality of photomasks are arranged so that an end region of an downstream photomask is overlapped with an end region of an upstream photomask when they are observed from the scanning direction of the substrate, and that the positions of the first and the second apertures in the end region of one photomask are the same as the positions of the first and the second apertures in the end region of the other photomask in the direction intersecting the scanning direction of the substrate, and the areas of the first and the second apertures in the end regions are a half of the areas of those apertures in the central regions of the photomasks.

6. A method for an alignment processing, comprising:

while scanning a substrate in a constant direction at a constant speed, making two polarized lights produced by splitting a polarized light with a beam splitter, that are different in incident angle to the substrate, respectively pass through first and second apertures formed in a photomask arranged alternately at a constant pitch in a direction intersecting the scanning direction of the substrate, to irradiate the substrate with the two lights, to irradiate an alignment film coating the substrate, to thereby form a plurality of first alignment regions and a plurality of second alignment regions having different alignment states of adjacent to each other on the alignment film, wherein the plurality of photomasks each are formed by setting the widths of the first and the second apertures in the direction intersecting the scanning direction of the substrate so that adjacent end regions of the adjacent first and second alignment regions parallel to the substrate-scanning direction overlap with each other with an overlapping dimension equal to an absolute value of a tracking accuracy of the photomasks of tracking a movement of the substrate in the direction intersecting the scanning direction when they are observed from the scanning direction of the substrate, and the plurality of photomasks are arranged alternately in the direction intersecting the scanning direction of the substrate so that the first and the second apertures are arranged alternately at a constant pitch in the direction intersecting the scanning direction of the substrate, wherein the beam splitter is disposed so that its reflective plane is at an intermediate position between the first and the second apertures of the photomask and in a plane substantially perpendicular to the photomask, to make one polarized light of the two polarized lights be incident into the first aperture at a predetermined angle, and to make the other polarized light of the two polarized lights be incident into the second aperture at an angle different from the above angle, each photomask is moved so as to track a movement of the substrate in the direction intersecting the scanning direction of the substrate, while irradiating the substrate with the two lights through the first and second apertures, and the plurality of first alignment regions and the plurality of second alignment regions are formed so that their adjacent end regions overlap with each other over the entire exposure region of the substrate.

* * * * *